United States Patent [19]

Brown, Jr. et al.

[11] 3,882,327

[45] May 6, 1975

[54] ABSOLUTE VALUE CIRCUIT EMPLOYING OPPOSITE CONDUCTIVITY TYPE SWITCHES

[76] Inventors: Alfred Brown, Jr., Philadelphia, Pa.; Kenneth Mansfield Schlesier, Stockton, N.J.

[22] Filed: June 7, 1974

[21] Appl. No.: 477,189

[52] U.S. Cl. .................. 307/236; 307/251; 328/140

[51] Int. Cl. .................. H03k 5/00

[58] Field of Search .................. 307/236, 251, 242; 328/140

[56] References Cited

UNITED STATES PATENTS

| | | | |
|---|---|---|---|
| 3,509,372 | 4/1970 | Bicking | 307/251 |
| 3,509,474 | 4/1970 | Arnold et al. | 307/236 |
| 3,566,145 | 2/1971 | Goodale | 307/236 |
| 3,591,854 | 7/1971 | Cole | 307/251 |

*Primary Examiner*—John Kominski

*Attorney, Agent, or Firm*—Edward J. Morton; Joseph S. Tripoli

[57] ABSTRACT

A circuit for providing an output signal having a magnitude substantially equal to the absolute value of an input signal. The circuit utilizes a signal comparator and two semiconductor devices of opposite conductivity type to guide the input signals through the circuit to a device which inverts the polarity of input signals having a given polarity and maintains the polarity of input signals having a polarity opposite that of the given polarity.

12 Claims, 2 Drawing Figures

ABSOLUTE VALUE CIRCUIT EMPLOYING OPPOSITE CONDUCTIVITY TYPE SWITCHES

Figure 1:
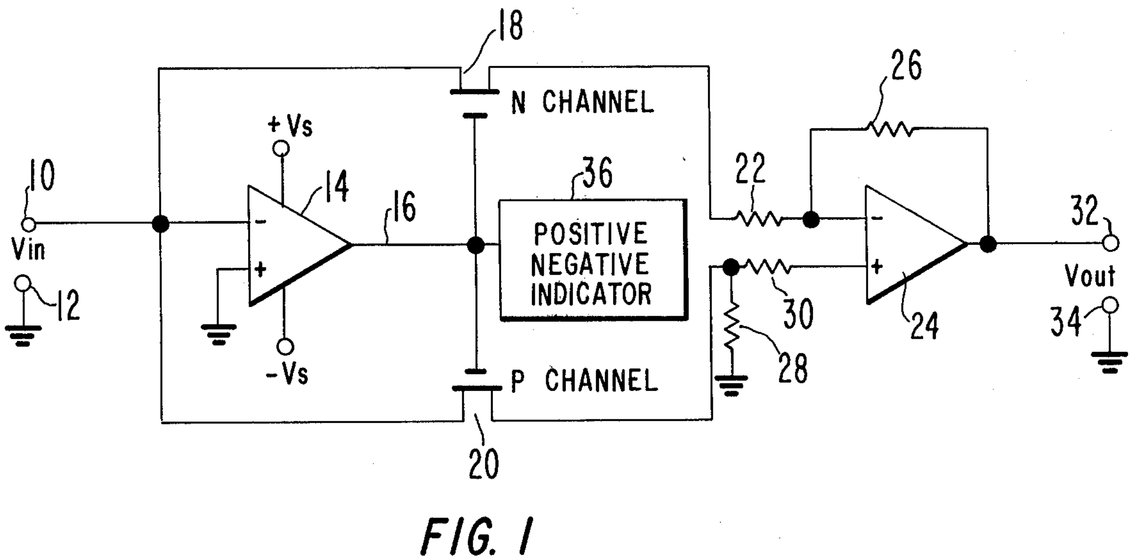

The present invention is generally directed to absolute value circuits and more specifically directed to absolute value circuits having a very small error factor at low levels of input signal.

There are several approaches to absolute value circuits in the prior art. One example of such a circuit is found in U.S. Pat. No. 3,509,372. In the aforementioned patent an inverting operational amplifier is used in conjunction with a unipolar device (a diode) and a pair of opposite conductivity, junction type, field effect transistors. For one polarity of input signal the inverting amplifier of the prior art circuit provides a signal which turns on one of the transistors causing the input signal at that polarity to appear at the output terminal. For the opposite polarity input signal, the prior art circuit operational amplifier acts like an amplifier and passes the input signal with an inverted polarity through the unipolar device to the output terminal via the main current path of the second transistor.

The problem with the particular prior art circuit mentioned, as well as many other known absolute value circuits, arises from the utilization of unipolar devices in the signal paths. The diode devices, which are commonly used in circuits of this nature, require a finite forward voltage to initiate current conduction therethrough. This requirement, in combination with the way in which the prior art circuits are arranged, often results in a situation which has been termed "rounding error." Rounding errors arise in the prior art absolute value circuits at low levels of input signals. That is, the output signal is unable to track the input signal for low levels of applied input signals. The main reason for rounding errors in prior art absolute value circuits is that at low input levels the diodes in the signal path cannot be turned on or turned on fully. There may be other active elements as well as diodes in a given absolute value circuit which might tend to add to the problem of rounding errors.

The circuit of the present invention provides an output signal which is substantially equal to the absolute value of the input signal even at very low input voltage signal levels. A circuit of this type is especially useful in applications where large dynamic range and high accuracy are required. One particular application for such a circuit is the preparation of analog signals for further processing in, say, a computer. Here, analog signals must be prepared for further processing by first digitizing the signals. Certain types of A/D converters respond to one polarity of input signal, for example, only positive voltage levels. Thus, in such a digitizing process, the analog signals are passed through an absolute value circuit which responds only to positive voltages. In this regard, it is also useful in many applications to have some indication as to whether the original input signal was positive or negative. The circuit of the present invention provides a convenient means for determining the original polarity of the input signal as well as providing the absolute value thereof.

In accordance with the present invention there is provided a circuit having at least one input terminal adapted for connection to a source of input signals. A signal comparator means is responsive to the input signals and to a reference signal level for providing one control signal when the input signal is at one polarity relative to the reference signal and for providing another control signal when the input signal is at another polarity relative to the reference signal level. In addition, first and second semiconductor switching devices of opposite conductivity types are provided. The first device is responsive to the one control signal for providing one low impedance signal path for the one polarity of the input signal and the second device is responsive to the other control signal for providing another low impedance path for input signals having the other polarity. A signal translation means is coupled to the first and second devices for inverting the polarity of the signal provided over the one low impedance path and for maintaining the polarity of the signal provided over the other low impedance signal path. The signal translation means thus provides an output signal which is substantially equal to the absolute value of the input signal.

IN THE DRAWING

Figure 2:
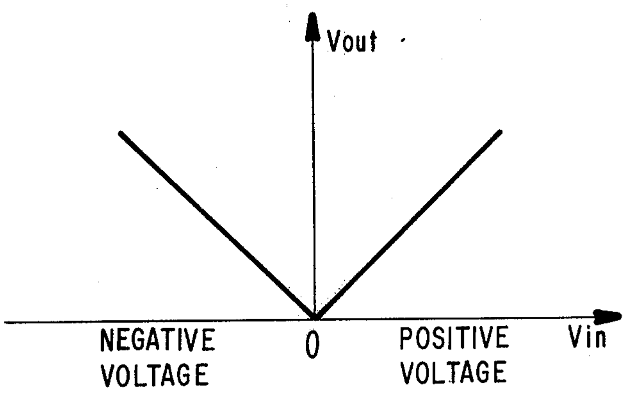

FIG. 1 is a schematic diagram of one embodiment of the present invention; and FIG. 2 is a graphical representation of the voltage input-output characteristic of the circuit shown in FIG. 1.

Referring now to FIG. 1, a source of input signals (not shown) is connected to a pair of input terminals 10 and 12. Input terminal 10 is connected to the inverting input terminal of operational amplifier 14 which is arranged to function as a comparator. The non-inverting input terminal of comparator 14 is connected to a point of reference potential, which, in this embodiment of the invention is at ground potential. Biasing for comparator 14 is provided via sources of potential (not shown) which generate voltages of plus V*s* and minus V*s*. Comparator 14 operates in the following manner. When the input signal is positive with respect to the reference level, i.e., greater than zero volts, the comparator 14 saturates and provides an output signal, on line 16, which is a voltage level very nearly at the value of minus V*s*. That is, in this case, for positive polarity input signals, a negative voltage level appears on line 16. When the input signal applied to terminal 10 is negative in polarity with respect to the reference level, i.e., less than 0 volts, the comparator 14 saturates in the opposite direction and provides an output signal, on line 16, which is a voltage level very nearly at the value of plus V*s*. That is, for negative polarity input signals, a positive voltage level appears on line 16. A typical, commercially available, device which may be used for this application is the CA3747CE.

Two semiconductor switching devices 18 and 20 are provided, each having two main electrodes and a control electrode. Switch 18 comprises an N-channel MOS device and switch 20 comprises a P-channel MOS device in the present embodiment. Input terminal 10 is connected to one main electrode of switching device 20 and to one main electrode of switching device 18. The control, or gate, electrodes of devices 18 and 20 are each connected to line 16, that is, the output line of comparator 14. As is known in the MOS art, a positive voltage applied to the gate electrode of an N-channel device tends to turn the device on, whereas, a positive voltage applied to the gate electrode of a P-channel device tends to turn off or keep off this device. Also, a negative voltage applied to the gate electrode of an N-channel device tends to turn off or keep off this device, whereas, a negative voltage applied to the gate electrode of a P-channel device tends to turn this device on. When MOS devices 18 and 20 are turned on, a low impedance path is provided across the main electrodes thereof. When MOS devices 18 and 20 are turned off, a high impedance path is provided across the main electrodes thereof.

The other main electrode of device 18 is connected to one end of resistor 22. The other end of resistor 22 is connected to the inverting input terminal of operational amplifier 24. Feedback resistor 26 is connected between the output terminal and the inverting input terminal of amplifier 24. The other main electrode of device 20 is connected to one end of resistor 28 and one end of resistor 30. The other end of resistor 28 is connected to a point at ground potential while the other end of resistor 30 is connected to the non-inverting input terminal of amplifier 24. The output terminal of amplifier 24 is connected to one circuit output terminal 32 of the two output terminals 32 and 34 across which the output voltage Vout is developed. A typical commercially available device which may be used to implement amplifier 24 is CA3747CE. Typical values for the resistors mentioned are as follows.

| | | | |
|---|---|---|---|
| R22 | 20,000 ohms | R28 | 20,000 ohms |
| R26 | 20,000 ohms | R30 | 10,000 ohms. |

Operational amplifier 24 is arranged with the selection of resistors 22, 26, 28 and 30 to operate as an inverting amplifier. That is, signals applied to the inverting input terminal of amplifier 24 will be provided with the opposite polarity at the output terminal thereof, whereas, signals applied to the non-inverting input terminal will appear at the output terminal of amplifier 24 without a change of polarity, that is, the polarity of the applied input signal is maintained in this case.

The operation of the absolute value circuit of FIG. 1 is as follows. If a negative input signal, i.e., less than 0 volts, is applied to input terminal 10, then a positive voltage level, or control voltage level, is generated on line 16. This positive control voltage turns on N-channel device 18 and tends to turn off or keep off P-channel device 20. The low impedance path provided across the main electrodes of the N-channel device 18 couples the input signal through via resistor 22 to the inverting input terminal of amplifier 24. Amplifier 24 now inverts the negative polarity input signal and provides a positive output signal which is substantially equal in absolute magnitude to the original input signal.

If a positive input signal, i.e., greater than 0 volts, is applied to input terminal 10, then a negative control voltage level appears on line 16. This negative control voltage turns on P-channel device 20 and tends to turn off or keep off N-channel device 18. The low impedance path provided across the main electrodes of the P-channel device couples the input signal, via resistors 28 and 30, to the non-inverting input terminal of amplifier 24. Amplifier 24 now maintains the polarity of the signal applied thereto and provides a positive output signal which is substantially equal in absolute magnitude to the original input signal.

Thus, it will be seen that the circuit of FIG. 1 provides a positive polarity output signal across terminals 32 and 34 having a magnitude substantially equal to the absolute value of the input signal applied across terminals 10 and 12.

In some applications it may be desirable to have some indication of the original polarity of the input signal as well as the absolute value. The arrangement of FIG. 1 allows for a most convenient manner for developing such an indication. Line 16 carries signals of substantial value, nearly $+V_s$ and $-V_s$ volts, which are directly related to the polarity of the input signal. It will be recalled that whenever the input signal is above 0 volts, line 16 is at a voltage level near $-V_s$ volts. Whenever the input signal is below zero volts, line 16 is at a voltage level near $+V_s$ volts. Thus a positive-negative indicator 36 is connected to line 16 and is responsive to the positive and negative voltage levels on line 16 to indicate the polarity of the input signal. Indicator 36 may take many forms such as one or more lights, a resettable flip-flop, a meter movement or any other indicator arrangement operating off a distinct positive and a distinct negative voltage level.

Referring now to FIG. 2, the static characteristic of the circuit of FIG. 1 shows that for any polarity of input signal, i.e., plus or minus, the output voltage is positive and is substantially equal to the magnitude of the input voltage. In prior art absolute value circuits where steering diodes have been used, rounding errors are developed and these errors would appear in a characteristic such as shown in FIG. 2 in the vicinity of the origin of the graph. That is, at low input signal levels the curve would tend to flatten out.

It has been found that the circuit of FIG. 1 maintains a linear voltage transfer characteristic down to the order of 1 millivolt. At zero input volts, the circuit of FIG. 1 has an output offset on the order of 1 millivolt. Some of the prior art absolute value circuits using steering diodes have output offsets on the order of 20 millivolts at zero input voltage.

FIG. 1 represents only one embodiment of the present invention in that it is a simple matter to rearrange the devices such that one may obtain a negative output voltage having a magnitude substantially equal to the absolute value of the input voltage. Also, it will be seen that the circuit of FIG. 1 is amenable to implementation in monolithic integrated circuit or hybrid circuit form.

In some prior art absolute value circuits the input and output impedance values can vary depending upon the polarity of the input signal. The circuit of FIG. 1 can be arranged to have constant input and output impedances. When the N-channel device 18 is turned on the input impedance is that of the comparator 14 in parallel with resistor 22. When the P-channel device 20 is turned on, the input impedance is that of comparator 14 in parallel with resistor 28. The impedance represented by resistors 22 and 28 can be made equal to each other, at a value of 20 K ohms in this case, and therefore the input impedance of the circuit will not vary with the polarity of the input signal. In addition, the output impedance of the circuit of FIG. 1 is determined by amplifier 24. The output impedance will, therefore, be independent of input signal polarity.

Resistor 30, in the circuit of FIG. 1, is included to help compensate for the input offset current of amplifier 24. The exact value for resistor 30 may therefore be selected for the particular amplifier used. For certain types of amplifiers, resistor 30 may not be required in the circuit of FIG. 1.

What is claimed is:

1. A circuit comprising:

at least one input terminal adapted for connection to a source of input signals;

a signal comparator means responsive to said input signals and to a reference signal level for providing one control signal when the input signal is at one polarity relative to said reference signal level and a second control signal when the input signal is at another polarity relative to said reference signal level;

first and second semiconductor switching devices of opposite conductivity types, said first device being responsive to said one control signal for providing one low impedance signal path for said one polarity of the input signal, said second device being responsive to said second control signal for providing another low impedance signal path for said other polarity of input signal; and signal translation means coupled to said first and second devices for inverting the polarity of the signal provided via said one low impedance path and for maintaining the polarity of the signal provided via said other low impedance path, said signal translation means providing an output signal substantially equal to the absolute value of the input signal.

2. The circuit according to claim 1 wherein said first and second semiconductor switching devices comprise N-channel and P-channel MOS transistors, respectively.

3. The circuit according to claim 2 wherein said signal translation means comprises an operational amplifier having an inverting input terminal connected to the low impedance path provided by said first device and a non-inverting input terminal connected to the low impedance path provided by said second device.

4. The circuit according to claim 3 further comprising a polarity indicating means responsive to said first and second control signals for providing an indication of the polarity of said input signal.

5. A circuit comprising:

a pair of circuit input terminals adapted for connection to a source of input signals;

a signal comparator having first and second input terminals and an output terminal, said first comparator input terminal being connected to one of said circuit input terminals, said second comparator input terminal being connected to a point of reference potential and to said other circuit input terminal, said signal comparator providing a first control voltage level at said comparator output terminal when the voltage at said first input terminal of said comparator is positive with respect to said reference potential and a second control voltage level at said comparator output terminal when the voltage at said first input terminal of said comparator is negative with respect to said reference level;

first and second normally closed semiconductor switching devices of opposite conductivity types, each having first and second main electrodes and a control electrode, the control electrode of said first and said second device being connected to said comparator output terminal, one main electrode of said first and of said second device being connected to said one of said circuit input terminals, said first device providing a low impedance path for said input signals in response to said first control voltage level and said second device providing a low impedance path for said input signals in response to said second control voltage level; and a signal translation means having a pair of input terminals and an output terminal, one input terminal of said translation means being connected to the other main electrode of said first device, the other input terminal of said translation means being connected to the other main electrode of said second device, said signal translating means operative to pass input signals of a given polarity and to invert the polarity of input signals having a polarity opposite the given polarity, whereby the signals provided at the output terminal of said translation means are substantially equal to the absolute value of the input signals.

6. The circuit according to claim 5 further comprising a polarity indicator means connected to said comparator output terminal and responsive to said first and to said second control voltage levels for indicating the polarity of the input signal.

7. The circuit according to claim 5 wherein said signal comparator comprises an operational amplifier having an inverting input terminal connected to said one circuit input terminal and a non-inverting input terminal connected to said point of reference potential.

8. The circuit according to claim 5 further comprising:

a first resistor connected between the other main electrode of said second device and the other input terminal of said signal translation means; and a second resistor connected between the other main electrode of said first device and said point of reference potential;

said first and second resistors having resistance values such that the input impedance of said circuit remains the same for input signals of said given polarity and for input signals of a polarity opposite the given polarity.

9. The circuit according to claim 8 wherein said first and second resistors have equal resistance values.

10. The circuit according to claim 9 further comprising a third resistor connected between said other main electrode of said first device and said one input terminal of said signal translation means.

11. The circuit according to claim 7 wherein said first device comprises a P-channel MOS transistor and said second device comprises an N-channel MOS transistor.

12. The circuit according to claim 11 wherein said signal translation means comprises a second operational amplifier having an inverting input terminal connected to the other main electrode of said N-channel device and a non-inverting input terminal connected to the other main electrode of said P-channel device, said second operational amplifier being operative to provide a signal substantially equal to the absolute value of said input signal at the output terminal thereof.

* * * * *

UNITED STATES PATENT OFFICE

CERTIFICATE OF CORRECTION

PATENT NO. : 3,882,327

DATED : May 6, 1975

INVENTOR(S) : Alfred Brown, Jr., Kenneth Mansfield Schlesier

It is certified that error appears in the above-identified patent and that said Letters Patent are hereby corrected as shown below:

The Assignee has been erroneously omitted. The patent should read:

Assignee: RCA Corporation, New York, N.Y.

Signed and Sealed this

*fifth* Day of *August 1975*

[SEAL]

*Attest:*

RUTH C. MASON
*Attesting Officer*

C. MARSHALL DANN
*Commissioner of Patents and Trademarks*